(12) United States Patent
Goulet et al.

(10) Patent No.: US 9,435,828 B2
(45) Date of Patent: Sep. 6, 2016

(54) METHOD OF RECONSTRUCTING ELECTRICAL PROBES

(71) Applicant: GLOBALFOUNDRIES INC., Grand Cayman (KY)

(72) Inventors: David R. Goulet, Milton, VT (US); Walter V. Lepuschenko, Fairfax, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 485 days.

(21) Appl. No.: 13/900,857

(22) Filed: May 23, 2013

(65) Prior Publication Data

US 2014/0347038 A1 Nov. 27, 2014

(51) Int. Cl.
*G01R 3/00* (2006.01)
*G01R 1/067* (2006.01)
*G01R 35/00* (2006.01)

(52) U.S. Cl.
CPC ............. *G01R 1/06738* (2013.01); *G01R 3/00* (2013.01); *G01R 35/00* (2013.01); *H01J 2237/208* (2013.01); *H01J 2237/3174* (2013.01)

(58) Field of Classification Search
CPC .... G01R 1/06738; G01R 3/00; G01R 35/00; H01J 2237/208; H01J 2237/3174
USPC .................................................... 204/192.34
See application file for complete search history.

(56) References Cited

U.S. PATENT DOCUMENTS

| | | | |
|---|---|---|---|
| 5,864,199 A | 1/1999 | Alvis et al. | |
| 5,993,281 A | 11/1999 | Musket | |
| 6,304,527 B1 * | 10/2001 | Ito | B82Y 20/00 369/112.01 |
| 6,633,711 B1 | 10/2003 | Pilevar et al. | |
| 7,259,934 B2 | 8/2007 | Chang et al. | |
| 7,356,900 B2 | 4/2008 | Munekane | |
| 2008/0217555 A1 | 9/2008 | Ward et al. | |

FOREIGN PATENT DOCUMENTS

JP  2005-308619  * 11/2005

OTHER PUBLICATIONS

Menozzi et al.; Focused ion beam-nanomachined probes for improved electric force microscopy; Ultramicroscopy, vol. 104, Issue 3-4, Oct. 2005; pp. 220-225.
Mulder et al.; Focused Ion Beam Method for Reconditioning Worn Tungsten Atomic Force Probe Tips; ISTFA 2005: Proceedings of the 31 International Symposium for Testing and Failure Analysis; Published: Oct. 2005, pp. 484-488.
Gao et al.; Focused ion beam milled CoPt magnetic force microscopy tips for high resolution domain images; IEEE Transactions Magnetics; vol. 40, Issue: 4, Part: 2, Publication Year: 2004, pp. 2194-2196.
Dietrich et al.; Ion Beam Machining of Very Sharp Points; ip.com Technical Disclosure; IPCOM000044002D; Oct. 1, 1984; pp. 3039-3040.
Cronin, J. E.; Process Method for Making a Sharp Tip; ip.com Technical Disclosure; IPCOM000102865D; Research Disclosure No. 311; Mar. 1, 1990; 2 pages.

* cited by examiner

*Primary Examiner* — Rodney McDonald
(74) *Attorney, Agent, or Firm* — Thompson Hine LLP; Anthony Canale

(57) ABSTRACT

A probe, comprising: a shank region having a top surface integrally connected to a bottom surface of a conical region; a pyramidal tip region having a base surface integrally connected to a top surface of the conical region; and wherein the base surface of the pyramidal tip region is contained within a perimeter of the top surface of the conical region. Also a method of fabricating the probe and a method of probing devices under test.

6 Claims, 7 Drawing Sheets

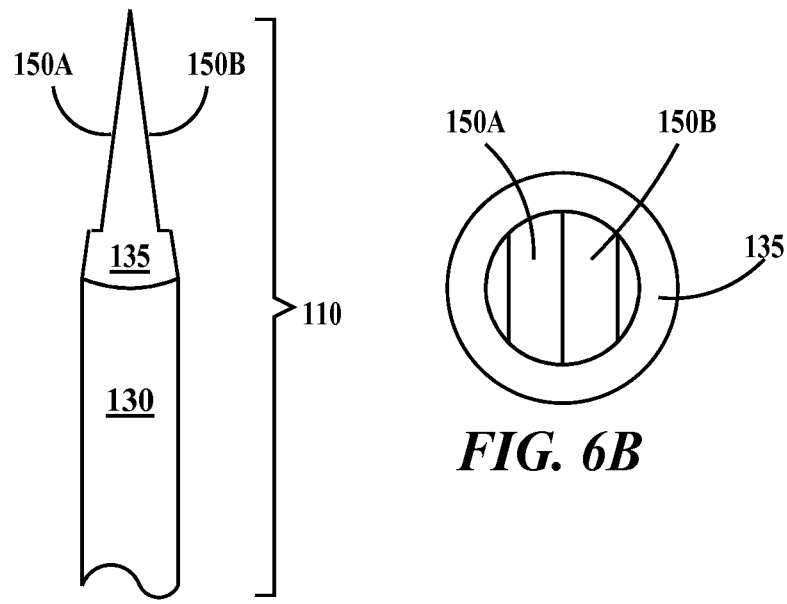
FIG. 6A
FIG. 6B
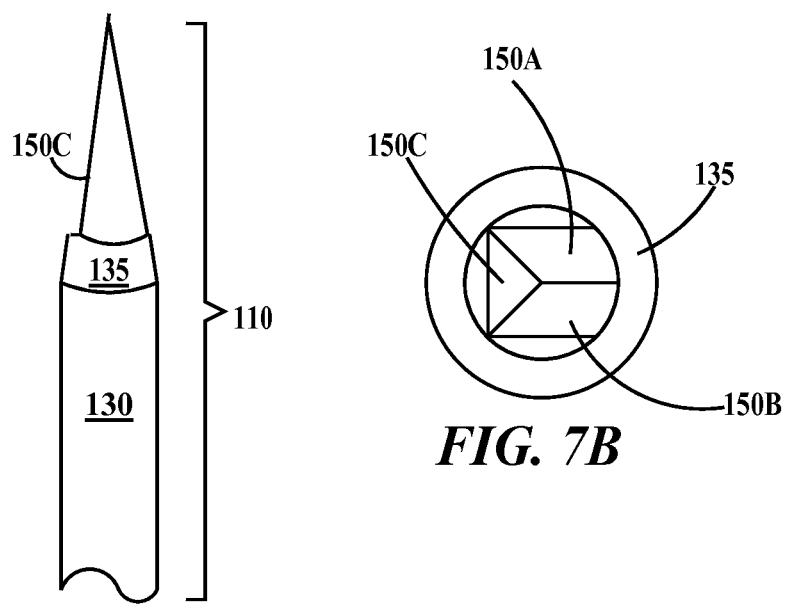
FIG. 7A
FIG. 7B

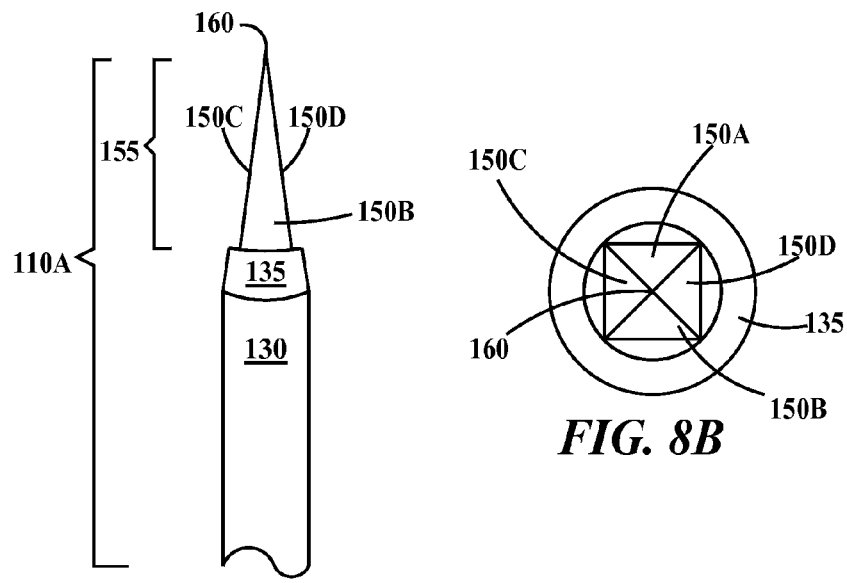
FIG. 8A
FIG. 8B
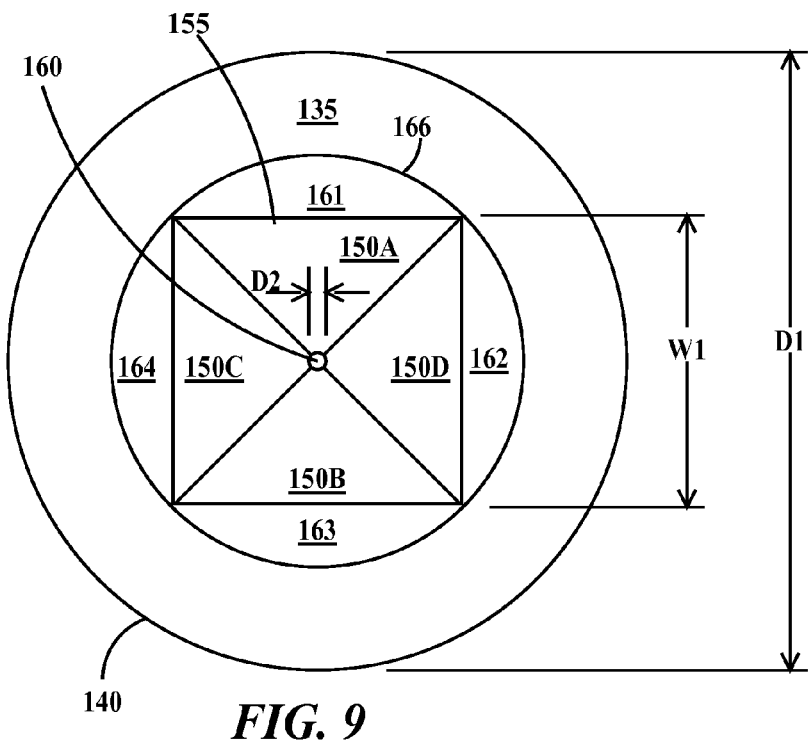
FIG. 9

METHOD OF RECONSTRUCTING ELECTRICAL PROBES

TECHNICAL FIELD

The present invention relates to the field of electrical probing; more specifically, it relates to electrical probes and methods of reconstructing electrical probes.

BACKGROUND

Electrical probes are used to make temporary electrical connections to integrated pads on circuits. During use the probes may become deformed, contaminated and or oxidized resulting in poor contact between the probe and the pad causing noisy and inaccurate electrical measurement results. Accordingly, there exists a need in the art to eliminate the deficiencies and limitations described hereinabove.

BRIEF SUMMARY

A first aspect of the present invention is a probe, comprising: a shank region having a top surface integrally connected to a bottom surface of a conical region; a pyramidal tip region having a base surface integrally connected to a top surface of the conical region; and wherein the base surface of the pyramidal tip region is contained within a perimeter of the top surface of the conical region.

A second aspect of the present invention is a method, comprising: providing a probe comprising a shank region having a top surface integrally connected to a bottom surface of a conical region, the conical region tapering to a point; ion milling a pyramidal tip region having a base and an apex into an upper portion of the conical region, the ion milling removing surface portions of the upper portion of the conical region and removing the point, the apex becoming a new point; and after the ion milling, a lower portion of the conical region remaining.

A third aspect of the present invention is a method, comprising: using a probe having a tapered probe tip having a point to electrically test a device under test by physically and electrically contacting the device under test with the point; after the testing, ion milling a pyramidal tip having a new point into the tapered probe tip; and after the ion milling, electrically testing the device under test or another device under test by physically and electrically contacting the device under test or the new device under test with the new point.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 6A is a side view and FIG. 6B is a top view of a wire probe after a third reconstruction step according to embodiments of the present invention;

FIG. 7A is a side view and FIG. 7B is a top view of a wire probe after a fourth reconstruction step according to embodiments of the present invention;

FIG. 8A is a side view and FIG. 8B is a top view of a wire probe after a fifth reconstruction step according to embodiments of the present invention;

FIG. 9 is a top view of a wire probe after reconstruction according to embodiments of the present invention;

DETAILED DESCRIPTION

The embodiments of the present invention reconstruct probes by ion milling a solid probe using a focused ion beam (FIB) tool in order to form a new probe tip and probe point. A pyramidal tip is defined as a solid figure with a polygonal base and triangular faces that meet at a common point.

Figure 1:
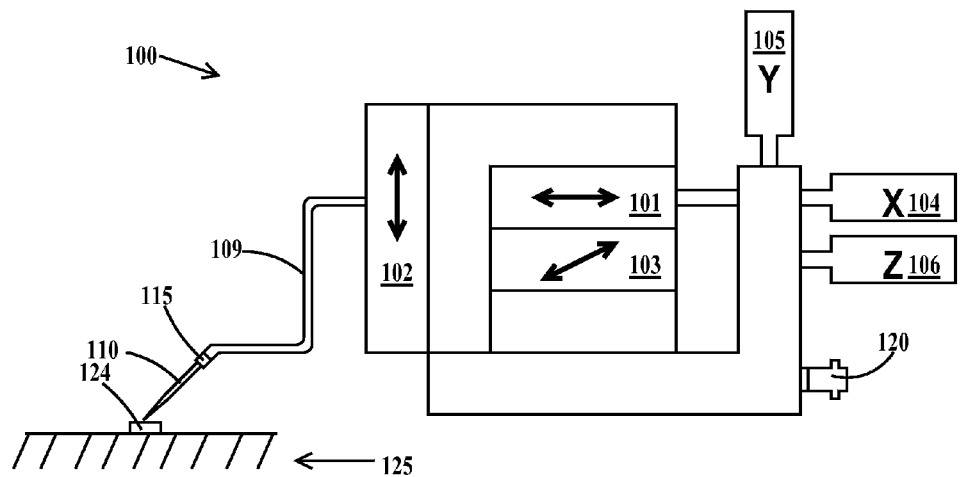
FIG. 1 is an exemplary application of electrical probing using a wire probe.

FIG. 1 is an exemplary application of electrical probing using a wire probe. In FIG. 1, a probe manipulator 100 includes respective X, Y and Z stages 101, 102 and 103 and respective X, Y and Z micrometers 104, 105 and 106 which move a flexible wire 109. An electrically conductive solid probe 110 is connected to wire 109 by a collet 115 allowing probe 115 to be removed. Probe 110 is electrically connected through wire 109 to a coaxial fitting 120 that allows connection to an electrical test apparatus. In FIG. 1, probe 110 is physically and electrically contacting an electrically conductive pad 124 on a semiconductor substrate 125 that may include, for example, wires and transistors that pad 125 is electrically connected to. Thus individual wires and transistors may be probed.

Figures 2, 3:
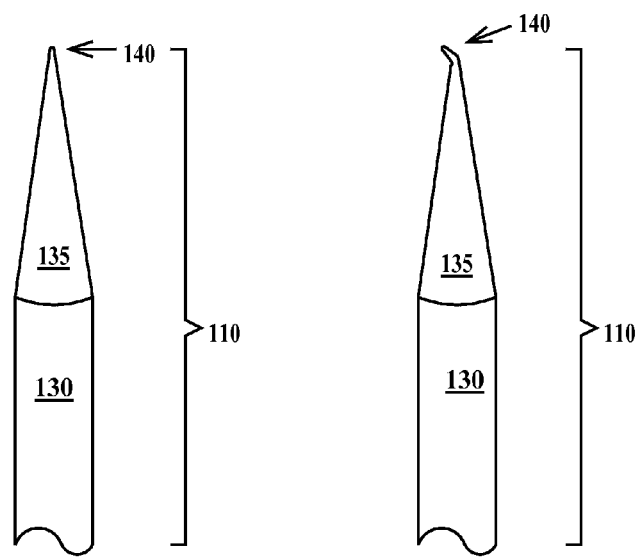
FIG. 2 is a side view of a wire probe as initially supplied by a vender.
FIG. 3 is a side view of a wire probe supplied by a vender after use.

FIG. 2 is a side view of a wire probe as initially supplied by a vender. In FIG. 2, probe 110 comprises a shank 130 and a conical tip 135 that tapers to a point 140. Probe 110 may be formed, for example, from tungsten, tungsten-rhenium, beryllium-copper or palladium alloy.

FIG. 3 is a side view of a wire probe supplied by a vender after use. In FIG. 3, probe 110 is shown after several touch downs on a test piece to illustrate how the extreme end of tip 135 may become bent. Also point 140 may become contaminated or oxidized.

Figure 4A:
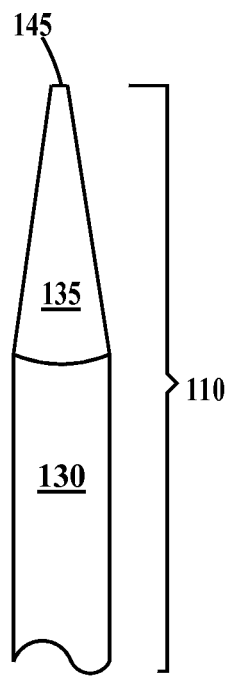
FIG. 4A is a side view and FIG. 4B is a top view of a wire probe after a first reconstruction step according to embodiments of the present invention.
Figure 4B:
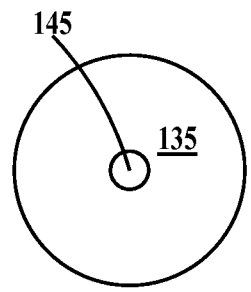

FIG. 4A is a side view and FIG. 4B is a top view of a wire probe after a first reconstruction step according to embodiments of the present invention. In FIGS. 4A and 4B a flat 145 has been ion milled, using for example, a focused ion beam on the extreme end of conical tip 135 thereby removing the bent end of point 135 of FIG. 3. This step is optional.

Figure 5A:
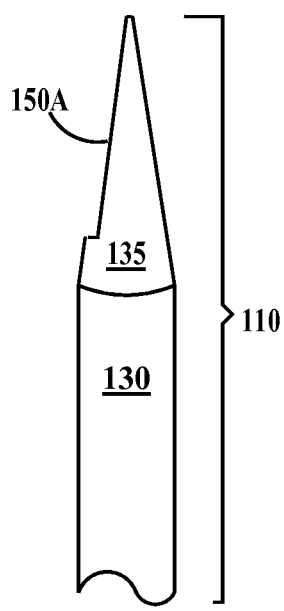
FIG. 5A is a side view and FIG. 5B is a top view of a wire probe after a second reconstruction step according to embodiments of the present invention.
Figure 5B:
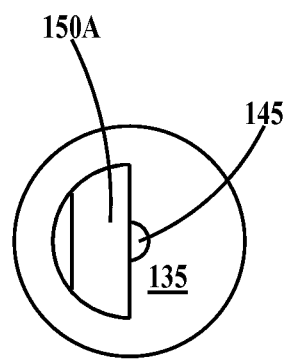

FIG. 5A is a side view and FIG. 5B is a top view of a wire probe after a second reconstruction step according to embodiments of the present invention. In FIGS. 5A and 5B a first flat surface 150A has been ion milled into conical tip 135, using for example, a focused ion beam on the extreme end of conical tip 135 thereby removing any contamination and/or oxidation and exposing a clean new surface. Milling first flat surface 150A does not require removing probe 110 from the ion milling machine/focused ion beam after milling flat 145 (See FIG. 4A), but merely repositioning the probe relative to the beam axis. See FIGS. 11 and 12.

FIG. 6A is a side view and FIG. 6B is a top view of a wire probe after a third reconstruction step according to embodiments of the present invention. In FIGS. 6A and 6B a second flat surface 150B opposite first flat surface 150A has been ion milled into conical tip 135, again using for example, a focused ion beam on the extreme end of conical tip 135 thereby removing any contamination and/or oxidation and exposing a second clean new surface. Milling second flat surface 150B does not require removing probe 110 from the ion milling machine/focused ion beam after milling surface 150A, but merely rotating the probe 180° relative to the beam axis. See FIGS. 11 and 12.

FIG. 7A is a side view and FIG. 7B is a top view of a wire probe after a fourth reconstruction step according to embodiments of the present invention. In FIGS. 7A and 7B a third flat surface 150C between and perpendicular to first and second flat surfaces 150A and 150B has been ion milled into conical tip 135, again using for example, a focused ion beam on the extreme end of conical tip 135 thereby removing any contamination and/or oxidation and exposing a second clean new surface. Milling third flat surface 150C does not require removing probe 110 from the ion milling machine/focused ion beam after milling surface 150B, but merely rotating the probe 90° relative to the beam axis. See FIGS. 11 and 12.

FIG. 8A is a side view and FIG. 8B is a top view of a wire probe after a fifth reconstruction step according to embodiments of the present invention. In FIGS. 8A and 8B a fourth flat surface 150D between and perpendicular to first and second flat surfaces 150A and 150B has been ion milled into conical tip 135, again using for example, a focused ion beam on the extreme end of conical tip 135 thereby removing any contamination and/or oxidation and exposing a second clean new surface. Milling fourth flat surface 150D does not require removing probe 110 from the ion milling machine/ focused ion beam after milling surface 150C, but merely rotating the probe 180° relative to the beam axis. See FIGS. 11 and 12. After the fifth milling step, reconstructed probe 110A, having a new square pyramidal tip 155 having a new point 160 has been formed. Point 160 is the apex of the pyramidal tip 155. Remnants of old conical tip 135 remain between shank 140 and tip 155. Alternatively, all of old conical tip 135 may (and even portions of shank 140) may be milled away so no surfaces of conical tip 135 remain.

The process described included, after milling flat 145 (see FIG. 4A), milling surface 150A, rotating probe 110 180°, milling surface 150B, rotating probe 110 90°, milling surface 150C, rotating probe 110 180° and milling surface 150D. Alternatively, the process may include, after milling flat 145 (see FIG. 4A), milling surface 150A, rotating probe 110 90°, milling surface 150C, rotating probe 110 90°, milling surface 150B, rotating probe 110 90° and milling surface 150D.

FIG. 9 is a top view of a wire probe after reconstruction according to embodiments of the present invention. In FIG. 9, shank 140 has a diameter of D1, the base of square pyramidal tip 155 has four sides (surfaces 150A, 150B, 150C and 150D) of nominal base length W1 and a point 160 having a diameter D2. Regions 161, 162, 163 and 164 of the top surface of conical tip 135 are exposed and not covered by pyramidal tip 155. The vertexes of perimeter of the base of pyramidal tip 155 (there are four vertexes) touch the circular perimeter 166 of the top surface of conical tip 135. In one example, D1 is between about 10 microns and about 15 microns. In one example, W1 is between about 6 microns and about 7 microns. Note, in one example, the lengths of the sides may independently vary by as much as plus or minus 0.5 microns from W1. In one example, D2 is between about 0.15 microns and about 0.35 microns.

Figure 10:
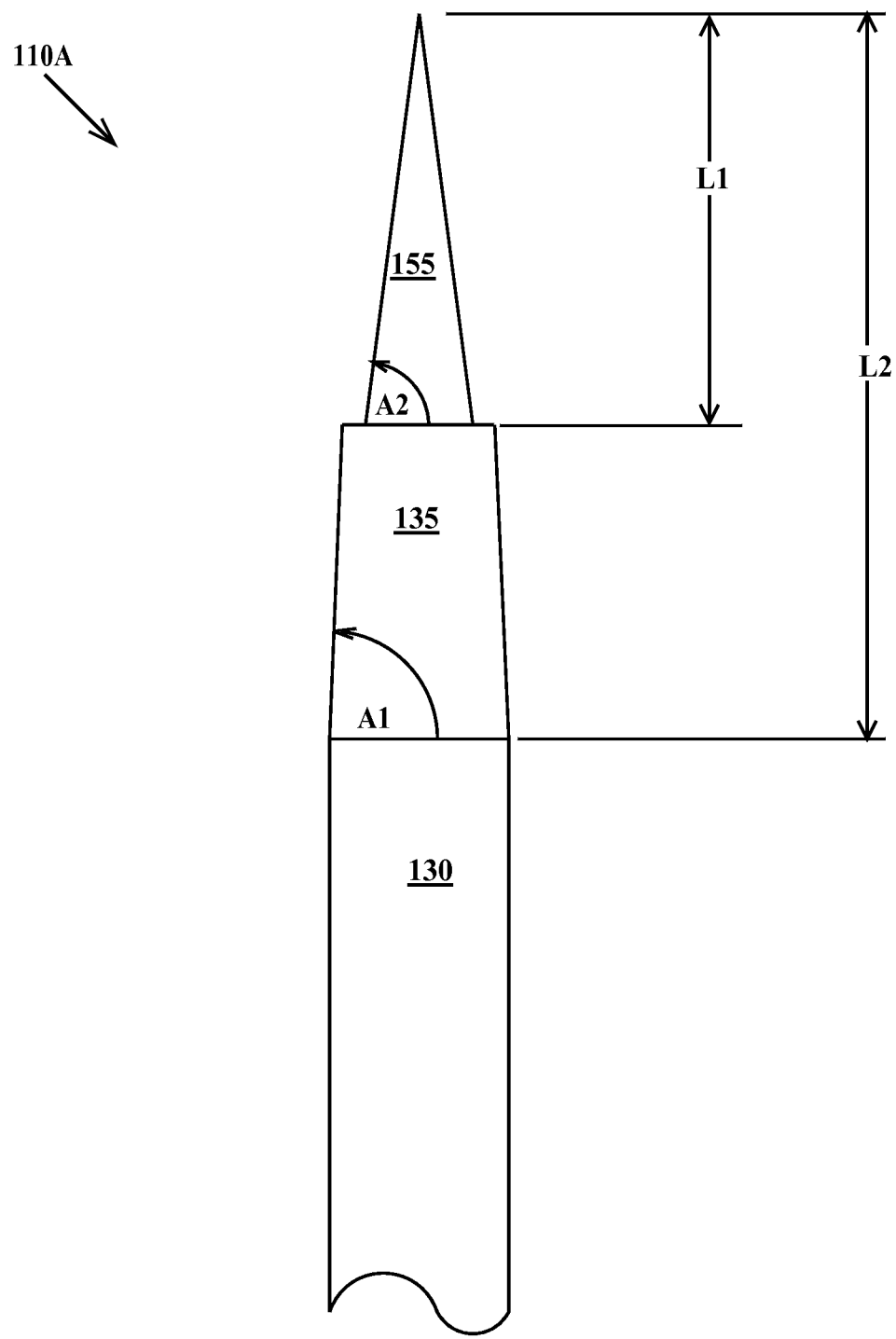
FIG. 10 is a side view of a wire probe after reconstruction according to embodiments of the present invention.

FIG. 10 is a side view of a wire probe after reconstruction according to embodiments of the present invention. In FIG. 10, length of pyramidal tip 155 is L1 and the length of un-milled conical tip 135 (if any) plus the length of pyramidal tip 155 is L2, where L1 is between about 15 microns and about 25 microns and L2 is between about 35 microns and about 45 microns. The angle of the sidewall of conical section 135 relative to a plane containing a diameter of shank 140 is A1 and angle of the sidewalls of pyramidal section 155 relative to a plane containing a diameter of shank 140 is A2. In one example, A1 is between about 62° and about 82°. In one example A2 is between about 69° and about 89°. In one example, A1 is different from A2. In one example, A1 is about equal to A2. In one example, A1 is greater than A2.

Alternatively to square or four-sided pyramidal tips (as illustrated in FIG. 9), the method of reconstructing probes can produce triangular or three-sided pyramidal tip or more generally N-sided pyramidal tips where N is an integer between 3 and 8. Referring back to FIG. 9, the base is illustrated as a square inscribed as inscribed in a circle. Alternatively the corners of the base of pyramidal tip 155 (or the corners of the base of an N-sided pyramidal tip) may be "moved in" away from the perimeter 166 so they do not touch the perimeter 166 in which case A2 may be greater than A1 if so desired.

Figure 11:
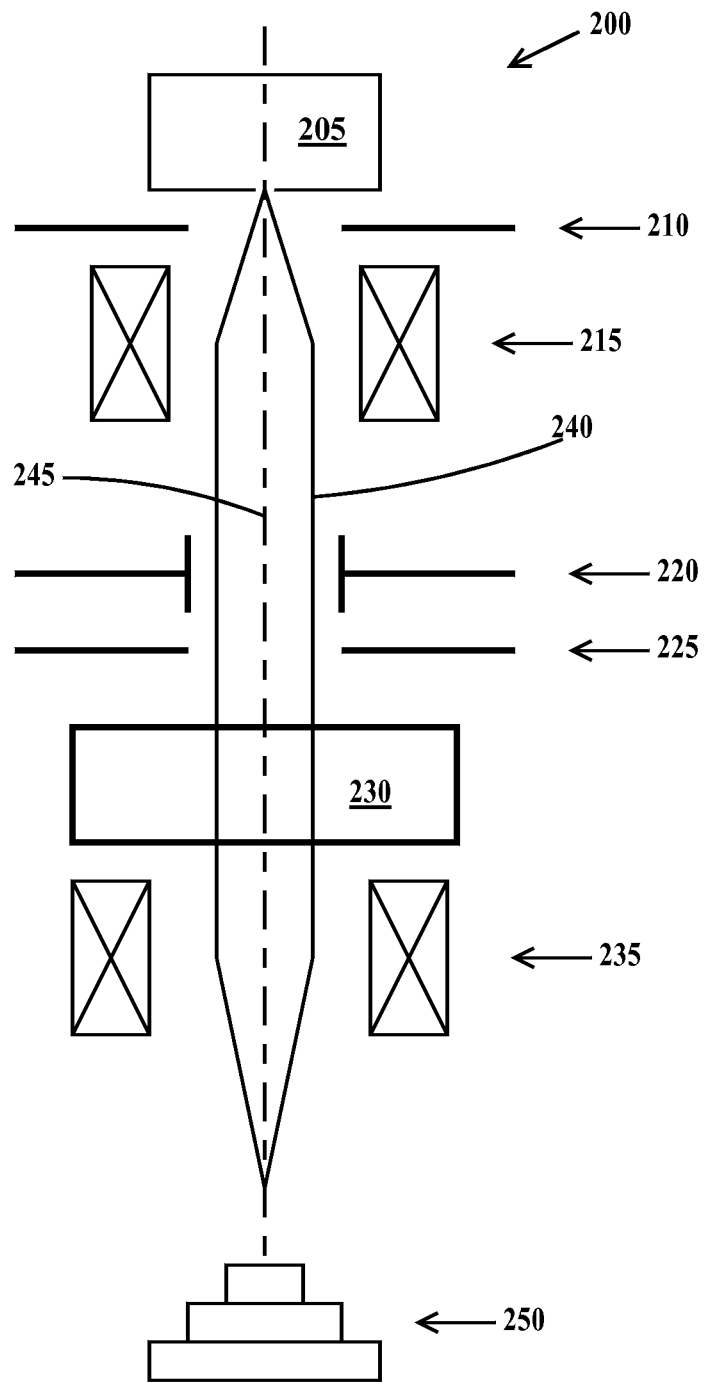
FIG. 11 is a schematic diagram of an exemplary focused ion beam tool.

FIG. 11 is a schematic diagram of an exemplary focused ion beam tool. In FIG. 11 a focused ion beam tool 200 includes an extractor 205 which is a source of gallium ions, a beam aperture 210, a first focusing lens 215, a beam blanker 220, a blanking aperture 225, a multi-pole deflection aperture 230 and a second focusing lens 235 which cooperate to shape and direct a heavy metal ion beam 240 (in this example gallium) along a central axis 245 to a stage 250. Beam 240 and stage 250 are contained within a vacuum.

Figure 12:
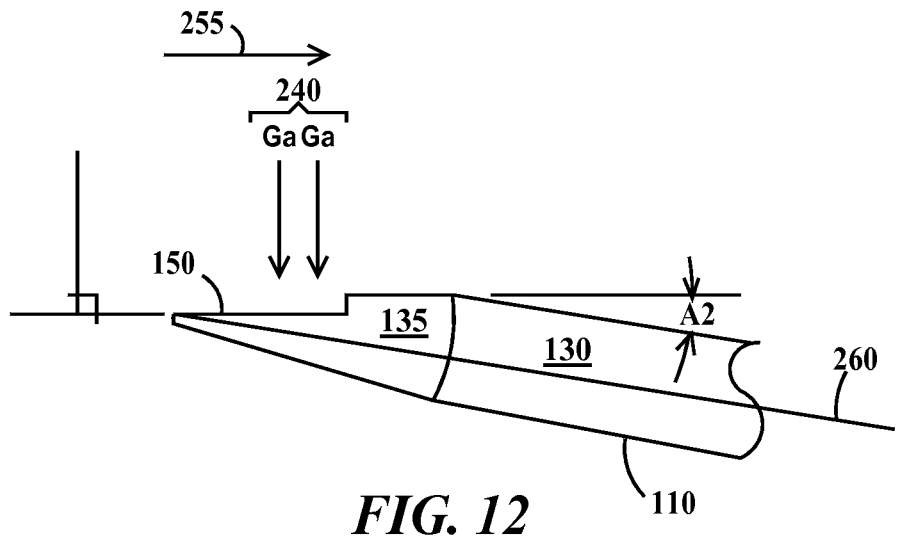
FIG. 12 is a side view illustrating milling a new face on a the tip of a wire probe according to embodiments of the present invention.

FIG. 12 is a side view illustrating milling a new face on a tip of a wire probe according to embodiments of the present invention. In FIG. 12, probe 110 is placed on a stage at angle A2 to a ion beam 240 (i.e. Ga) and either the stage moved relative to beam in a direction 255 so a surface 150 is milled that is perpendicular to the beam axis 245 (see FIG. 11) and parallel to direction 255 or the beam scanned. After milling of surface 150X, probe 260 is rotated 360/N degrees along the longitudinal axis 260 of probe 110 to mill the next surface, where N is the number of surfaces to be milled to produce an N sided pyramidal tip.

Figure 13:
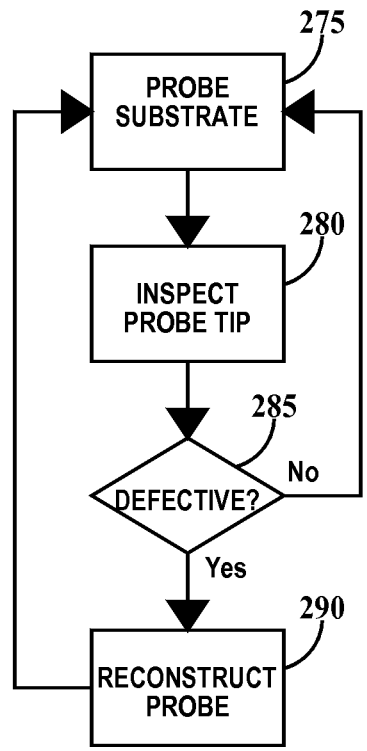
FIG. 13 is a flowchart illustrating a method for probing substrates according to embodiments of the present invention.

FIG. 13 is a flowchart illustrating a method for probing substrates according to embodiments of the present invention. In step 275, a substrate or device under test (DUT) is probed using a wire probe. In step 280, the probe tip is inspected for contamination, oxidation or physical deformation or other damage such a broken point. In step 280, if the probe is not defective, the method loops to step 275 where additional probing of the same or another substrate or DUT occurs. If in step 280, the probe is found to be defective (i.e., is contaminated, oxidized, deformed or broken) the method proceeds to step 290 where the probe is reconstructed using ion milling according to the embodiments of the present invention. The method then loops to step 275 where additional probing of the same or another substrate or DUT occurs. The probe may be reconstructed at least two times.

Thus the embodiments of the present invention provide a method of reconstructing electrical probes to provide new sharp and clean probe tips.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a probe comprising a shank region having a top surface integrally connected to a bottom surface of a conical region, said conical region tapering to a point;
   ion milling a pyramidal tip region having a base and an apex into an upper portion of said conical region, said ion milling removing surface portions of said upper portion of said conical region and removing said point, said apex becoming a new point; and
   after said ion milling, a lower portion of said conical region remaining,
   wherein said shank region has a uniform diameter, said lower portion of said conical region tapers from said shank region to said pyramidal tip region at a first angle, and said pyramidal tip region tapers from a base of said pyramidal tip region to said apex at a second angle.

2. The method of claim 1, wherein said ion milling is performed using a focused ion beam tool.

3. The method of claim 1, wherein said pyramidal tip region has N sides wherein N is a positive integer between 3 and 8 and further comprising:
   ion milling one of said N sides;
   rotating said probe by 360/N degrees; and
   repeating said milling and said rotating until all N sides have been ion milled.

4. The method of claim 1, wherein said pyramidal tip region has four sides, and further comprising:
   ion milling a first of said four sides;
   rotating said probe 180°;
   ion milling a second of said four sides;
   rotating said probe 90°;
   ion milling a third of said four sides;
   rotating said probe 180°; and
   ion milling a fourth of said four sides.

5. The method of claim 1, wherein said perimeter of an exposed top surface of said lower portion of said conical region is circular, and every vertex of a perimeter of a base surface of said pyramidal tip region touches said perimeter of said exposed top surface of said conical region.

6. The method of claim 1, wherein said probe is formed from a metal selected from the group consisting of tungsten, tungsten-rhenium, beryllium-copper and palladium alloy.

* * * * *